(12) United States Patent
Zwicknagl et al.

(10) Patent No.: US 6,548,882 B1
(45) Date of Patent: Apr. 15, 2003

(54) POWER TRANSISTOR CELL

(75) Inventors: Hans-Peter Zwicknagl, Stuttgart (DE); Peter Baureis, Kürnach (DE); Jan-Erik Müller, Ottobrunn (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/500,410

(22) Filed: Feb. 8, 2000

Related U.S. Application Data

(63) Continuation of application No. PCT/DE98/02283, filed on Aug. 7, 1998.

(30) Foreign Application Priority Data

Aug. 8, 1997 (DE) .......................................... 197 34 509

(51) Int. Cl.⁷ .......................... H01L 29/00; H01L 23/48; H01L 23/52; H01L 29/40
(52) U.S. Cl. ...................... 257/522; 257/774; 257/578; 257/584; 257/778
(58) Field of Search ................................ 257/522, 578, 257/584, 705, 747, 776, 778

(56) References Cited

U.S. PATENT DOCUMENTS

| | | | |
|---|---|---|---|
| 4,710,798 A | * 12/1987 | Marcantonio | 357/80 |
| 5,148,260 A | * 9/1992 | Inoue et al. | 357/67 |
| 5,308,440 A | 5/1994 | Chino et al. | |
| 5,734,193 A | * 3/1998 | Bayraktaroglu et al. | 257/579 |
| 5,793,067 A | * 8/1998 | Miura et al. | 257/183 |
| 5,825,092 A | * 10/1998 | Delgado et al. | 257/778 |

FOREIGN PATENT DOCUMENTS

| | | | |
|---|---|---|---|
| DE | 19614584 A1 | 10/1996 | |
| EP | 0 908 951 A2 | * 4/1999 | 257/778 |
| GB | 2278017 A | 11/1994 | |

OTHER PUBLICATIONS

"Effect of Device Layout on the Thermal Resistance of High–Power Thermally–Shunted Heterojunction Bipolar Transistors", E. Dettmer et al., IEEE 1996, pp. 1607–1610.
"High Efficiency AkGaAs.FaAs Power HBTs at a Low Supply Voltage for Digital Cellular Phones", T. Miura et al., GaAs IC Symposium 1996 Dig., pp. 91–94.

(List continued on next page.)

*Primary Examiner*—George Eckert
*Assistant Examiner*—Jesse A. Fenty
(74) *Attorney, Agent, or Firm*—Laurence A. Greenberg; Werner H. Stemer; Gregory L. Mayback

(57) ABSTRACT

A power transistor cell includes an air bridge and a plurality of individual transistors. Each of the plurality of individual transistors has at least one separate connection contact. Each of the at least one separate connection contact of the plurality of individual transistors is thermally conductively connected to one another through the air bridge forming air bridge connections, which define a contact plane. A surface of the contact plane that contains each connection path between two of the air bridge connections defines a convex region. The air bridge is formed to have, in the contact plane, dimensions that exceed a smallest convex region containing all of the air bridge connections in all directions of the air bridge. Each of the plurality of power transistor cells can be respectively thermally conductively connected to one another through the air bridge to form a block of power transistor cells. The air bridge has a dimension that significantly exceeds the length of the contact fingers in the longitudinal direction of the contact fingers, so that components of the air bridge that are present at the sides of a row of contact fingers can be mounted on metallic connection surfaces or on the substrate surface by conductive contact pillars. The configuration provides good heat dissipation from the individual transistors.

14 Claims, 2 Drawing Sheets

OTHER PUBLICATIONS

"Very High–Power–Density CW Operation of GaAs/AlGaAs Microwave Heterojunction Bipolar Transistors", Burhan Bayraktaroglu et al., IEEE Electron Device Letters, vol. 14, No. 10, Oct. 1993, pp. 493–495.

"The Effect of Thermal Shunt on the Current Instability of Multiple–Emitter–Finger Heeeterojunction Bipolar Transistors", L.L Liou et al., IEEE Bipolar Circuits and Technology Meeting, 1993, pp. 253–256.

"Decoupled Electrical/Thermal Modeling of AlGaAs/GaAs Heterojunction Bipolar Transistors", Robert Anholt et al., GaAs IC Symposium, 1996, pp. 167–170.

"High–Power, High–Efficienty K–Band AlGaAs/GaAs Heterojunction Bipolar Transistors", Hin–Fai Chau et al., GaAs IC Symposium, 1996, pp. 95–98.

* cited by examiner

POWER TRANSISTOR CELL

CROSS-REFERENCE TO RELATED APPLICATION

This is a continuation of copending International Application PCT/DE98/02283, filed Aug. 7, 1998, which designated the United States.

BACKGROUND OF THE INVENTION

Field of the Invention

The invention lies in the field of semiconductors. The present invention relates to power transistor cells, particularly heterojunction bipolar transistor power cells or monolithic microwave integrated circuits ("MMIC") power cells, which are thermally optimized by air bridges.

Heterojunction bipolar transistors ("HBT") are required for many applications using the microwave range, e.g., for mobile communication techniques. The particular advantages of HBTs and HBT-MMICs include high current-carrying capacity at high current densities, the high power amplification achieved with the current capacity and density, and the correspondingly high efficiency. These advantages can frequently not be achieved due to poor thermal conductivity of the semiconductor (e.g., gallium arsenide (GaAs)) substrate material. It is, therefore, necessary to ensure sufficient dissipation of the heat produced in the cells. Up to now, various means have been used in order to ensure sufficient heat dissipation. For example, the substrates used can be thinned to a thickness corresponding to the spacing between the heat sources. Metal-filled wells etched into the back of the substrate can be used as heat sinks below the transistors. Gold-plated holes can be used from the back of the substrate to the connection contact surfaces on the top in order to dissipate heat. The transistors can be mounted using the flip-chip construction technique. It is also possible to mount the transistors from the emitter connection surfaces on heat sinks using bumps, and to connect the collector and base regions on the back of the substrate. Appropriate holes are present for the electrical connection. It is also possible to grow the semiconductor layers of the transistor epitaxially on a highly thermally conductive substrate. Use of emitter or base ballast resistors can reduce the adverse effects of heat evolvement on the current stability of the transistor, but such use compromises the radio-frequency performance of the transistor.

Using air bridges provides one possibility for direct heat dissipation through the electrical connections of the transistor regions. Such air bridges are made of electrically and thermally conductive material, preferably of a suitable metal, and connect the contacts of the individual transistors in a cell electrically and thermally to one another in the form of a bridge. Such air bridges are described in the following publications: L. L. Liou et al., "The Effect of Thermal Shunt on the Current Instability of Multiple-Emitter-Finger Heterojunction Bipolar Transistors", IEEE 1993 Bipolar Circuits and Technology Meeting, pp. 253–256, 1993; B. Bayraktaroglu et al., "Very High-Power-Density CW Operation of GaAs/AlGaAs Microwave Heterojunction Bipolar Transistors", IEEE Electron Device Letters 14, 493–495 (1993); T. Miura et al., "High Efficiency AlGaAs/GaAs Power HBTs at a Low Supply Voltage for Digital Cellular Phones", GaAs IC Symposium 1996 Dig., pp. 91–94, 1996; R. Anholt et al., "Decoupled Electrical/Thermal Modeling of AlGaAs/GaAs Heterojunction Bipolar Transistors", IEEE GaAs IC Symposium Dig. 1996, pp. 167–170, 1996. With these HBTs, the emitter fingers are connected to one another using a respective air bridge. Connection of the collector metal connections of the individual HBT subcells through air bridges is described, for example, in the publication by H. F. Chau et al., titled "High-Power, High-Efficiency K-Band AlGaAs/GaAs Heterojunction Bipolar Transistors", IEEE GaAs IC Symposium 1996 Dig., pp. 95–98, 1996. A plurality of the measures described can be combined.

SUMMARY OF THE INVENTION

It is accordingly an object of the invention to provide a power transistor cell that overcomes the hereinafore-mentioned disadvantages of the heretofore-known devices of this general type and that is improved further with respect to thermal optimization.

With the foregoing and other objects in view, there is provided, in accordance with the invention, a power transistor cell, including an air bridge, and a plurality of individual transistors each having at least one separate connection contact, each of the at least one separate connection contact being thermally conductively connected to one another through the air bridge forming air bridge connections, the air bridge connections defining a contact plane, a surface of the contact plane that contains each connection path between two of the air bridge connections defining a convex region, the air bridge formed to have, in the contact plane, dimensions that exceed a smallest convex region containing all of the air bridge connections in all directions of the air bridge.

With the power transistor cell according to the invention, an air bridge is used that has a considerable extent not only in the direction of a series of individual transistors oriented in a row, but that also has a considerable extent perpendicularly to such direction in the plane of the substrate surface. Such an air bridge can, firstly, be produced to be particularly thick and, therefore, highly thermally conductive, and, secondly, can be provided with good heat dissipation or a heat sink, using additional thermal contacts on connection contact surfaces that are dimensioned to be relatively large or on the substrate surface. In the publications indicated, air bridges are described that are used to connect the emitter fingers, i.e., the finger-shaped emitter contacts, to one another using air bridges whose width is no larger than the length of the emitter fingers. With the normally short emitter lengths of between 20 $\mu$m and 30 $\mu$m, the transportation of heat in such essentially one-dimensional air bridges is effective in only one direction along the bridge. The relatively small lateral extent of the air bridge affords a correspondingly small volume to take up the heat produced (low thermal capacitance); the total heat dissipation to the chip surface occurs only through the two outermost transistor cells. In contrast to this, the air bridge present in the power transistor cell according to the invention has as large a surface as possible and, therefore, has a high thermal capacitance. By virtue of the air bridge also having a considerable extent in the longitudinal direction of the emitter fingers, it is also possible to support the air bridge by thermally conductive contact pillars or supports mounted on the chip top or on contact surfaces and, at the same time, to dissipate the heat into the substrate or into metal layers applied thereon. It is also possible to route such thermally conductive connections through via holes in the substrate onto the back of the substrate. The air bridge present in the power transistor cell according to the invention is called a two-dimensional air bridge below, in order to distinguish it from the air bridges described in previous publications.

In accordance with another feature of the invention, the at least one separate connection contact is elongate and has a length, and the air bridge protrudes beyond the at least one separate connection contact by at least 15% of the length of the at least one separate connection contact in a longitudinal direction of the at least one separate connection contact.

In accordance with a further feature of the invention, the at least one separate connection contact is elongate and has a length, and the air bridge protrudes beyond the at least one separate connection contact by at least 30% of the length of the at least one separate connection contact in a longitudinal direction of the at least one separate connection contact.

In accordance with an added feature of the invention, the at least one separate connection contact is elongate and has a length, and the air bridge protrudes beyond the at least one separate connection contact by at least 100% of the length of the at least one separate connection contact in a longitudinal direction of the at least one separate connection contact.

In accordance with an additional feature of the invention, the air bridge has a surface and has a thickness perpendicular to the surface of between 20 µm and 30 µm.

In accordance with yet another feature of the invention, there is provided a chip with a chip top, and a plurality of thermally conductive contact pillars, the air bridge being mounted on the chip top by the plurality of thermally conductive contact pillars.

In accordance with yet a further feature of the invention, there is provided a plurality of thermally conductive contact pillars, the air bridge mounted on the convex region by the plurality of thermally conductive contact pillars.

In accordance with yet an added feature of the invention, the air bridge and the plurality of thermally conductive contact pillars are electrically conductive, and the at least one separate connection contact is electrically conductively connected to the convex region by the air bridge and the plurality of thermally conductive contact pillars.

In accordance with yet an additional feature of the invention, the plurality of individual transistors is a plurality of bipolar transistors each having an emitter, a base, a collector, the at least one separate connection contact is one of group consisting of at least one emitter finger formed as an emitter connection contact, at least one base finger formed as a base connection contact, and at least one collector contact formed as a collector connection contact, and every one of the at least one separate connection contact is thermally conductively connected to one another by the air bridge.

In accordance with again another feature of the invention, there is provided one of a group consisting of an emitter connection surface, a base connection surface, and a collector connection surface, and a plurality of thermally and electrically conductive contact pillars, the air bridge being electrically conductive and mounted on a respective one of a group consisting of the emitter connection surface, the base connection surface, and the collector connection surface by the plurality of thermally and electrically conductive contact pillars.

In accordance with again a further feature of the invention, there is provided a base connection surface, the at least one separate connection contact being at least one base finger formed as a base connection contact, and the air bridge being mounted on each of the at least one base finger and on the base connection surface.

In accordance with again an added feature of the invention, the at least one base finger is at most 1 µm wide.

In accordance with again an additional feature of the invention, there is provided a heat sink, the air bridge being an integral component of the heat sink.

In accordance with still another feature of the invention, there is provided a housing, the air bridge being an integral component of the housing.

In accordance with a concomitant feature of the invention, there is also provided a block of power transistor cells, including an air bridge, and a plurality of power transistor cells, each of the a plurality of power transistor cells including a plurality of individual transistors each having at least one separate connection contact, each of the at least one separate connection contact being thermally conductively connected to one another through the air bridge forming air bridge connections, the air bridge connections defining a contact plane, a surface of the contact plane that contains each connection path between two of the air bridge connections defining a convex region, the air bridge formed to have, in the contact plane, dimensions that exceed a smallest convex region containing all of the air bridge connections in all directions of the air bridge, whereby each of the plurality of power transistor cells are respectively thermally conductively connected to one another through the air bridge to form a block of power transistor cells.

Other features that are considered as characteristic for the invention are set forth in the appended claims.

Although the invention is illustrated and described herein as embodied in a power transistor cell, it is nevertheless not intended to be limited to the details shown, because various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
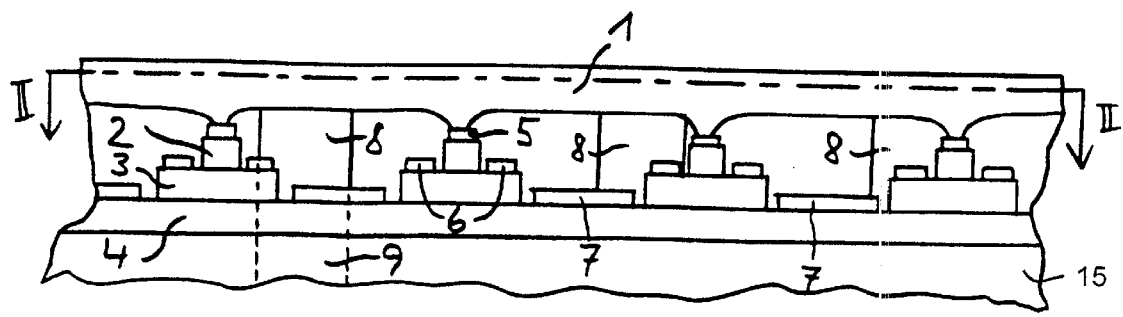
FIG. 1 is a diagrammatic, fragmentary, side cross sectional view of a cell according to the invention having an air bridge.

In all the figures of the drawing, sub-features and integral parts that correspond to one another bear the same reference symbol in each case.

Referring now to the figures of the drawings in detail and first, particularly to FIG. 1 thereof, there is shown a cross-sectional and somewhat diagrammatic illustration of a power cell including a plurality of individual transistors. A thermally conductive and preferably also electrically conductive air bridge 1 connects together the emitter fingers 5 mounted as contacts on the emitters 2. In the case of an electrically conductive air bridge, there is no separate electrical connection for the emitter fingers. On the base region 3, there are connection contacts, also in the form of fingers (in each case), as base fingers 6. Collector contacts 7 are mounted accordingly on the collector region 4. The invention involves no restriction on the shape of the contacts as compared with embodiments that are usual for conventional power transistor cells, apart from the fact that the air bridge must have suitable mounting surfaces available. Contact pillars 8 disposed behind the plane of the drawing in the viewing direction are also shown in FIG. 1. These contact pillars 8 make the thermal and preferably also electrical connection between the air bridge 1 and the top of the chip or emitter connection surfaces present on the top of the chip. The surface having the contact pillars mounted on it should preferably be as large as possible. The surface can take up the whole of the free chip surface, apart from the surfaces for the base and collector connection surfaces.

Figure 2:
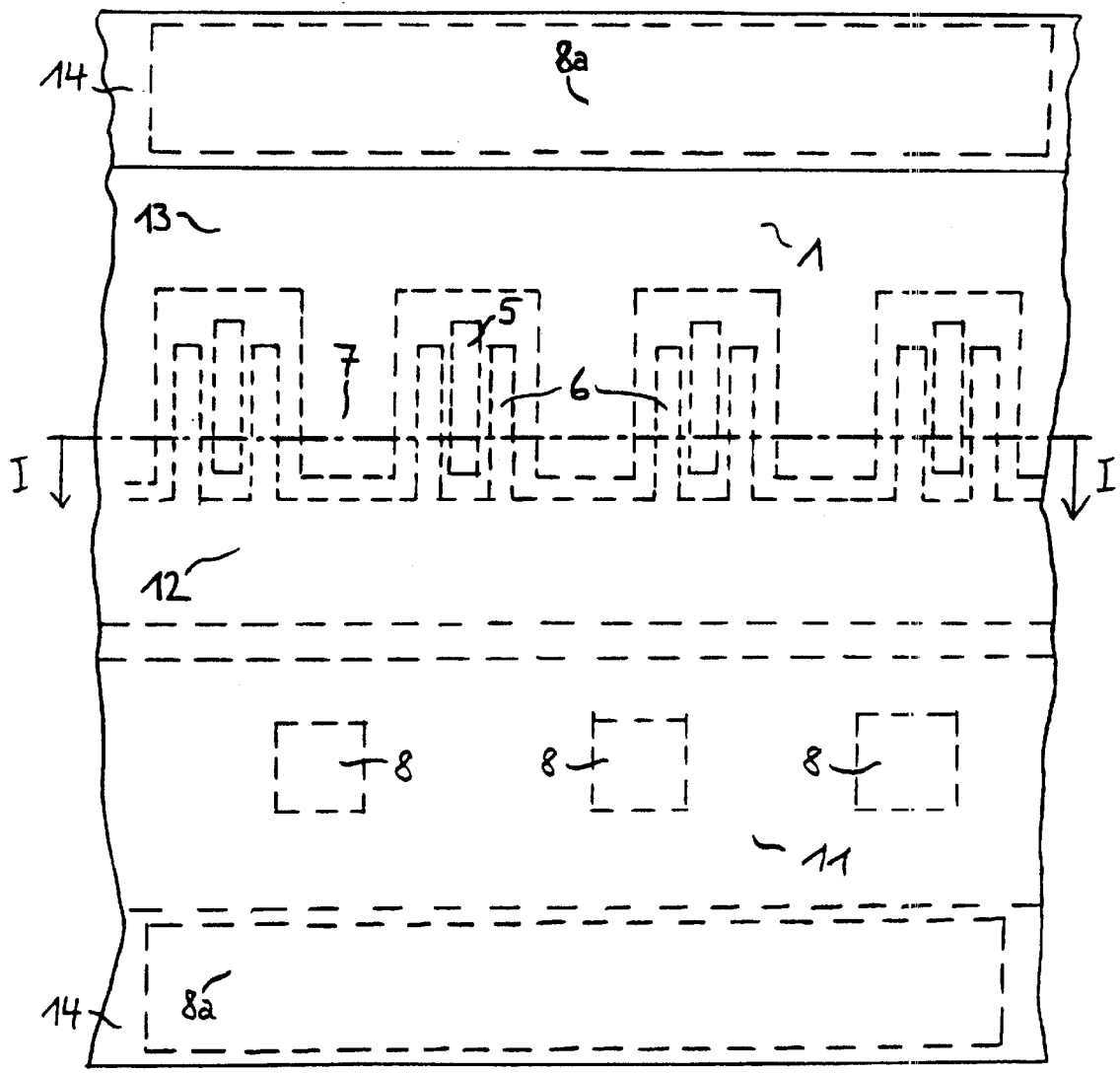
FIG. 2 is a diagrammatic, fragmentary plan view of the cell according FIG. 1.

FIG. 2 shows a plan view of the configuration of FIG. 1. The extensive air bridge 1 is shown with straight edges at the top and bottom in the plane of the drawing, and with break lines on the left and right, which indicate that the air bridge extends further. In the example of FIG. 2, the air bridge continues to the left and right according to the number of individual transistors present. The emitter fingers 5, the base fingers 6, and the collector contacts 7 are shown by dashes as hidden contours, as are the contact pillars 8. The base fingers 6 are electrically conductively connected to a base connection surface 12; the collector contacts 7 are electrically conductively connected to a collector connection surface 13. The components shown are not all in the same plane.

In the embodiment shown in FIG. 2, the air bridge 1 uses both the individual transistors' emitter fingers 5 provided as contacts for the emitters and also the common emitter connection surface 11 as mounting surfaces for the pillars of the air bridge. The air bridge is, therefore, mounted on the emitter fingers 5, as can be seen in FIG. 1. Some of the contact pillars 8, 8a can be mounted on the top 14 of the chip made of semiconductor material (contact pillars 8a in FIG. 2), and some can be mounted on the emitter connection surface 11 (contact pillars 8 in FIG. 2). The air bridge 1 and the contact pillars 8 are preferably electrically conductive, and the electrical connection for the emitter fingers 5 is made through the contact pillars 8 mounted on the emitter connection surface 11. The common collector connection surface 13 is fully or partly spanned by the air bridge 1. In the collector connection surface 13, the total collector current is picked up from the individual transistors. Preferably, the air bridge 1 also fully or partly spans the base connection surface 12, which is used to drive the base regions of the individual transistors. The connection surfaces can, in principle, also be disposed and dimensioned as desired.

It is advantageous if the air bridge is mounted over as large an area as possible on the metal emitter connection surface 11 or on the chip top 14. Dissipation of heat and thermal coupling are possible within the whole top 14 of the substrate 15. The significantly improved heat distribution in the power transistor cell according to the invention causes the thermal resistance of the transistors to be lowered by approx. thirty percent (30%), as compared with transistor cells having a one-dimensional air bridge, if there is an approximately 6 $\mu$m thick two-dimensional air bridge. By way of example, using a 6 $\mu$m thick two-dimensional air bridge made of gold in an 8-finger HBT having an emitter surface of eight times 3×30 $\mu m^2$, a thermal resistance of 80 K/W is achieved. Such thermal resistance is lower in comparison to an approximately 120 K/W thermal resistance when a one-dimensional air bridge is used.

Figure 3:
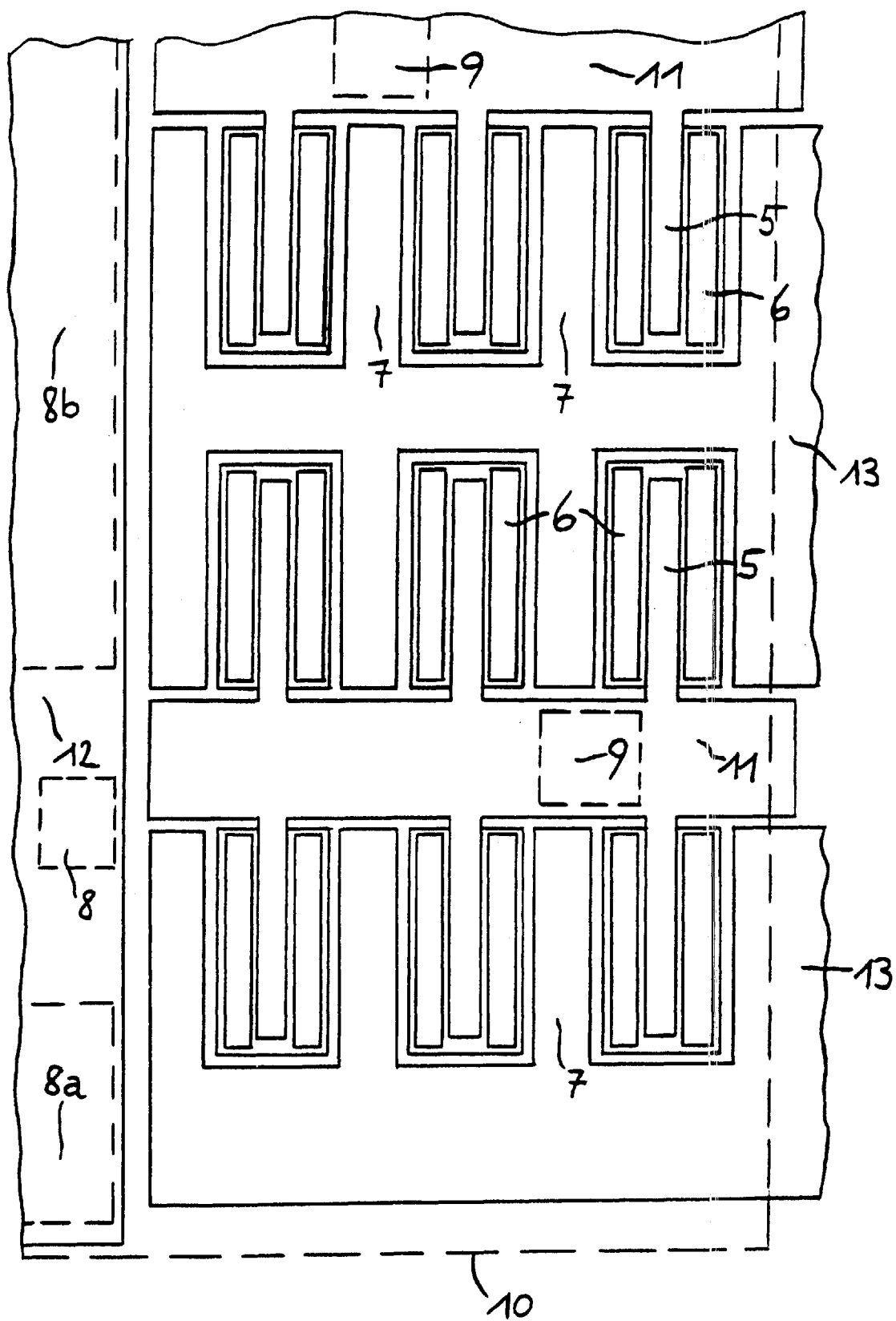
FIG. 3 is diagrammatic, fragmentary plan view of an alternative embodiment of the cell according FIG. 1.

FIG. 3 shows an alternative embodiment in which the power transistor cells are provided with an air bridge 10 which electrically and thermally connects the base fingers 6 to one another. The emitter fingers 5, the base fingers 6, and the collector contacts 7 having emitter connection surfaces 11 associated in blocks, having a common base connection surface 12, and having collector connection surfaces 13, which are also provided in blocks, are shown in a detail as an example of such a power transistor cell configuration. The bottom and right-hand straight edges (in the plane of the drawing) of the air bridge 10 disposed above this are shown in dashes. The transistor configuration continues upward arbitrarily in the plane of the drawing. The bottom and right-hand straight edges of the base connection surface 12 are likewise shown and continue to the left and upward in accordance with the break lines shown.

The air bridge 10 is mounted on the base fingers 6 and, by contact pillars 8, on the base connection surface 12. By way of example, contact pillars 8a, 8b having different dimensions are shown on the base connection surface 12 with dashed edges. The contact pillars 8a have considerably larger lateral dimensions, whereas the contact pillar 8b covers the largest portion of the base connection surface 12, or can cover the whole base connection surface 12. In this embodiment too, at least a portion of the contact pillars can be mounted on the top 14 of the chip made of semiconductor material. In conjunction with a sufficient vertical thickness of the air bridge (measured perpendicular to the chip top 14), effective dissipation of heat can, thus, take place from the base fingers 6 into the base connection surface 12 or into the substrate 15.

The comparatively extensive two-dimensional air bridge can be produced using standard lithography and a usual lacquer thickness of, typically, 3 $\mu$m. In comparison with previously described air bridges, having a typical thickness of 6 $\mu$m, the air bridges can also be produced with a significantly larger thickness, i.e., 20 to 30 $\mu$m, using the conventional method. For producing such thicknesses, keeping the necessary spacings between two two-dimensional air bridges (depending on the height of the air bridge) does not constitute any restriction, because only a few air bridges are generally present per chip. It is also possible to work with thick lacquer layers and, thus, achieve a corresponding thickness when electrodeposition methods are used. Therefore, the air bridges described can be made very thick (at least 20 $\mu$m thick), so that the thermal resistance is again reduced by, typically, 30%. The bridge arches of the air bridge preferably have a maximum spacing from the chip top of between approximately 3 $\mu$m and 5 $\mu$m.

The power transistor cell according to the invention solves the additional problem of thermal coupling in large power blocks, in which a plurality of power cells have to be connected together. A plurality of individual transistors connected together is in one power transistor cell. A plurality of power cells can be connected to one another to form power blocks. An extensive air bridge makes it possible to thermally couple together the emitter fingers, not only of individual power cells, but also all the emitter fingers of such a block making up the plurality of power cells. The connection of the emitter fingers through an air bridge can, in principle, be extended to any desired number of power cells. An extensive air bridge can be used to improve the current stability of the power cells to such an extent that emitter or base ballast resistors can be reduced or omitted completely. The initial family of characteristic curves for the collector current remains stable up to high collector-emitter voltages when such air bridges are used. The effect cannot be achieved with a conventional one-dimensional air bridge.

The thermal resistance and the junction temperature established during operation of the transistor cells significantly affect the radio frequency and power data for the HBT cells and circuits. An increase in the junction temperature by 20 K results in a reduction in the gain by approx. 0.4 dB. In the case of a one-dimensional air bridge, a large portion (e.g., half) of the individual transistors contributes only as undesirable parasitic capacitors, when the so-called "current hogging" effect occurs. There is a dip in the d.c. gain, the output power, the efficiency, and the radio frequency gain, and the power cell is overloaded. The intensive thermal coupling and improved heat dissipation in the embodiment according to the invention result, due to the reduced thermal resistance, in a lower and homogeneously distributed junction temperature, and also in uniform electrical utilization of the individual transistors. Therefore, multi-emitter HBTs having both considerably larger emitter surfaces and a high gain at the same time can be produced.

Alternative embodiments of the power transistor cells according to the invention are HBT-MMICs. The HBT-MMICs can be used to produce power transistor configurations having a significantly reduced chip surface—typically by approximately a factor of 6.

The embodiment shown in FIG. 3 using an air bridge for the base connections has, in particular, the advantage of even better heat dissipation. Heat dissipation and thermal coupling become all the more effective the more extensive the highly thermally conductive metal contacts supporting the air bridge can be produced, and the nearer the metal contacts can be disposed to the place where the heat is produced. At high powers, the most heat is produced below the thin base layer in the collector layer. The base contacts are, therefore, configured to be as close as possible symmetrically around the emitter as base fingers 6 (e.g., auto-aligned with respect to the emitter finger as well) and to be as extensive as possible. The configuration allows very narrow emitter fingers to be produced (e.g., one micron wide) for very high-frequency applications, so that the performance in the high-frequency range can be significantly improved. Narrow emitter fingers result in an increased thermal resistance, however. The two-dimensional air bridge 10 for the base can also particularly effectively dissipate the heat produced in the case of particularly narrow emitters, so that the d.c. voltage and radio frequency characteristics of the HBT benefit from the correspondingly lowered thermal resistance.

The embodiment of FIG. 3 can be modified accordingly with an air bridge 10 for the collector contacts 7. The air bridge 10 then, preferably, spans a large area of the base connection surface 12 and the emitter connection surface 11, through which the base fingers 6 and the emitter fingers 5 are driven. The thermal coupling (for a plurality of power cells connected to one another as well) is then produced by a two-dimensional air bridge mounted on the collector contacts 7, these collector contacts 7 being placed as close as possible to the respective base-emitter complexes.

In a further advantageous refinement, thermally and possibly electrically conductive connections are routed to the back of the substrate 15 through holes or vias in the substrate 15. Such connections 9 are shown in dashes in FIGS. 1 and 3. The back of the substrate 15 can be provided with a ground connection, for example. When flip-chip technology is used, the two-dimensional air bridge ensures that there are relatively short paths for the dissipation of heat before the heat is transferred to the heat sink through the relatively high elevations or bumps used for assembly in flip-chip technology. It is also possible for the top 14 of the substrate 15, having the air bridge 10, to be mounted on a heat sink for the housing. Contacts for the base and the collector are mounted on bonding pads (contact surfaces) that are provided on the back of the substrate 15 and are electrically conductively connected to the base and collector regions through vias in the substrate 15.

For the rest, it is sufficient for, first, only the contact pillars 8 to be mounted on the component on the emitter fingers 5 or the base fingers 6 or the collector contacts 7 instead of a complete air bridge 10, and for these contact pillars 8 to be connected to a heat sink or wall of a housing. The heat sink or wall of the housing then forms the two-dimensional air bridge 10. In such a context, in the power transistor cell according to the invention, the air bridge 10 can, thus, be a heat sink or an integral component of a housing used for assembly. The extensive dimension of the air bridge 10 is also significant in this example.

The two-dimensional air bridge present in the power transistor cell according to the invention and described with the aid of the embodiments shown can be transferred to all other power cells by analogy, for example, power diodes and diode arrays on any substrate material (e.g., Si, GaAs; impatt diodes, laser diodes), and power transistors on any substrate material (e.g., bipolar transistors, MOSFETs, MESFETs, HEMTs, JFETs).

In the power transistor cell according to the invention, or in a combined configuration of a plurality of such power transistor cells, the air bridge 1, 10 protrudes in all directions in the plane of the top 14 of the chip beyond the smallest convex region taken up by the contacts (emitter fingers, base fingers, collector contacts) that have the air bridge mounted on them. In such a case, a convex region is to be understood as being a surface that contains each connection path between two of its respective points. In a power transistor cell having a number of individual transistors, disposed in succession in a straight row, and having an air bridge 1 mounted on the emitter fingers 5, the smallest convex region is the smallest rectangle on the chip top 14 that contains all the emitter fingers 5. When a plurality of power transistor cells are combined, the denoted smallest convex region contains all the contact fingers having the air bridge 1, 10 mounted on them.

In one preferred embodiment, the air bridge protrudes beyond the emitter fingers by at least 30% of the length of the emitter regions in the longitudinal direction of the emitter fingers. In heterojunction bipolar transistors having emitter fingers with a typical length of approximately 30 $\mu$m, the air bridge can also protrude by 100% and more beyond the length of the emitter regions. In field-effect transistors, the contact fingers are generally much longer, e.g., typically 100 $\mu$m or a little less, with the air bridge then protruding only at least approximately 30% beyond the length of the contact fingers, also due to the greater space requirement of the electrical connections. With even longer contact fingers of, for example, approximately 500 $\mu$m, it may be necessary to limit the air bridge to a dimension which protrudes only 15 to 20% beyond the contact fingers in the direction of the contact fingers.

We claim:

1. A power transistor cell, comprising:

an air bridge; and individual transistors each having at least one separate connection contact;

each of said at least one separate connection contact being thermally conductively connected to one another through said air bridge forming air bridge connections;

said air bridge connections defining a contact plane;

said contact plane having a surface containing each connection path between two of said air bridge connections defining a convex region;

said air bridge having dimensions in said contact plane exceeding a smallest convex region containing all of said air bridge connections in all directions of said air bridge;

said at least one separate connection contact being elongate and having a length and a longitudinal direction; and said air bridge protruding beyond said at least one separate connection contact by at least 15% of said length in said longitudinal direction.

2. The power transistor cell according to claim 1, wherein said air bridge protrudes beyond said at least one separate connection contact by at least 30% of said length in said longitudinal direction.

3. The power transistor cell according to claim 1, wherein said air bridge protrudes beyond said at least one separate connection contact by at least 100% of said length in said longitudinal direction.

4. The power transistor cell according to claim 1, wherein said air bridge has a surface and has a thickness perpendicular to said surface of between 20 $\mu$m and 30 $\mu$m.

5. The power transistor cell according to claim 1, including a chip with a chip top, and a plurality of thermally conductive contact pillars, said air bridge being mounted on said chip top by said plurality of thermally conductive contact pillars.

6. The power transistor cell according to claim 1, including a plurality of thermally conductive contact pillars, said air bridge mounted on said convex region by said plurality of thermally conductive contact pillars.

7. The power transistor cell according to claim 6, wherein said air bridge and said plurality of thermally conductive contact pillars are electrically conductive, and said at least one separate connection contact is electrically conductively connected to said convex region by said air bridge and said plurality of thermally conductive contact pillars.

8. The power transistor cell according to claim 1, wherein said plurality of individual transistors is a plurality of bipolar transistors each having an emitter, a base, a collector, said at least one separate connection contact is one of group consisting of:

at least one emitter finger formed as an emitter connection contact;

at least one base finger formed as a base connection contact; and at least one collector contact formed as a collector connection contact, and every one of said at least one separate connection contact is thermally conductively connected to one another by said air bridge.

9. The power transistor cell according to claim 8, including one of a group consisting of an emitter connection surface, a base connection surface, and a collector connection surface, and a plurality of thermally and electrically conductive contact pillars, said air bridge being electrically conductive and mounted on a respective one of a group consisting of said emitter connection surface, said base connection surface, and said collector connection surface by said plurality of thermally and electrically conductive contact pillars.

10. The power transistor cell according to claim 8, including a base connection surface, said at least one separate connection contact being at least one base finger formed as a base connection contact, and said air bridge being mounted on each of said at least one base finger and on said base connection surface.

11. The power transistor cell according to claim 10, wherein said at least one base finger is at most 1 $\mu$m wide.

12. The power transistor cell according to one of claim 1, including a heat sink, said air bridge being an integral component of said heat sink.

13. The power transistor cell according to one of claim 1, including a housing, said air bridge being an integral component of said housing.

14. A block of power transistor cells, comprising:

an air bridge; and power transistor cells each including individual transistors;

each of said individual transistors having at least one separate connection contact;

each of said at least one separate connection contact being thermally conductively connected to one another through said air bridge forming air bridge connections;

said air bridge connections defining a contact plane;

said contact plane having a surface containing each connection path between two of said air bridge connections defining a convex region;

said air bridge having dimensions in said contact plane exceeding a smallest convex region containing all of said air bridge connections in all directions of said air bridge;

whereby each of said power transistor cells are respectively thermally conductively connected to one another through said air bridge to form a block of power transistor cells;

said at least one separate connection contact being elongate and having a length and a longitudinal direction; and said air bridge protruding beyond said at least one separate connection contact by at least 15% of said length in said longitudinal direction.

\* \* \* \* \*